United States Patent
Noda et al.

(10) Patent No.: US 12,184,036 B2
(45) Date of Patent: Dec. 31, 2024

(54) TWO-DIMENSIONAL PHOTONIC-CRYSTAL SURFACE-EMITTING LASER

(71) Applicant: KYOTO UNIVERSITY, Kyoto (JP)

(72) Inventors: Susumu Noda, Kyoto (JP); Takuya Inoue, Osaka (JP); Masahiro Yoshida, Kyoto (JP); Menaka De Zoysa, Muko (JP)

(73) Assignee: KYOTO UNIVERSITY, Kyoto (JP)

( * ) Notice: Subject to any disclaimer, the term of this patent is extended or adjusted under 35 U.S.C. 154(b) by 512 days.

(21) Appl. No.: 17/632,896

(22) PCT Filed: Aug. 4, 2020

(86) PCT No.: PCT/JP2020/029874
§ 371 (c)(1),
(2) Date: Feb. 4, 2022

(87) PCT Pub. No.: WO2021/039316
PCT Pub. Date: Mar. 4, 2021

(65) Prior Publication Data
US 2022/0271503 A1 Aug. 25, 2022

(30) Foreign Application Priority Data
Aug. 30, 2019 (JP) .................................. 2019-158767

(51) Int. Cl.
*H01S 5/11* (2021.01)
*H01S 5/042* (2006.01)
*H01S 5/18* (2021.01)

(52) U.S. Cl.
CPC ............ *H01S 5/11* (2021.01); *H01S 5/04256* (2019.08); *H01S 5/18* (2013.01)

(58) Field of Classification Search
None
See application file for complete search history.

(56) References Cited

U.S. PATENT DOCUMENTS

| | | | |
|---|---|---|---|
| 2009/0074024 A1* | 3/2009 | Noda | G11B 7/0903 |
| | | | 372/50.12 |
| 2013/0039375 A1* | 2/2013 | Noda | H01S 5/04256 |
| | | | 372/44.01 |
| 2019/0067907 A1* | 2/2019 | Noda | H01S 5/204 |

FOREIGN PATENT DOCUMENTS

| | | |
|---|---|---|
| JP | 2009-54795 A | 3/2009 |
| JP | 2009-231578 A | 10/2009 |

(Continued)

OTHER PUBLICATIONS

Oct. 19, 2022 Extended European Search Report issued in European Patent Application No. 20857819.5.

(Continued)

*Primary Examiner* — Tuan N Nguyen
(74) *Attorney, Agent, or Firm* — Oliff PLC

(57) ABSTRACT

A two-dimensional photonic-crystal surface-emitting laser includes an active layer, a two-dimensional photonic crystal, and electrodes. The two-dimensional photonic crystal contains a plate-shaped base material arranged on one side of the active layer and different refractive index portions arranged at lattice points of a predetermined lattice in the base material and having a refractive index different from that of the base material, a band edge frequency for each position in an electric current supply region, which is at least a part of the two-dimensional photonic crystal, is monotonically increased in one direction parallel to the base material. Such a two-dimensional photonic crystal occurs when the different refractive index portion has a refractive index smaller than that of the base material, a filling factor, which is a ratio of a volume occupied by the different refractive index portion in a unit lattice constituting the lattice, is monotonically increased in the one direction.

9 Claims, 14 Drawing Sheets

(56) References Cited

FOREIGN PATENT DOCUMENTS

| JP | 2012-134259 A | 7/2012 |
|----|---------------|--------|
| JP | 2013-41948 A  | 2/2013 |
| JP | 2018-144664 A | 9/2018 |

OTHER PUBLICATIONS

Oct. 20, 2020 Search Report issued in International Patent Application No. PCT/JP2020/029874.

Oct. 20, 2020 Written Opinion of the International Searching Authority issued in International Patent Application No. PCT/JP2020/029874.

* cited by examiner

[SECOND CALCULATION EXAMPLE]
DOUBLE HOLE
ELECTRIC CURRENT 12A

TWO-DIMENSIONAL PHOTONIC-CRYSTAL SURFACE-EMITTING LASER

TECHNICAL FIELD

The present invention relates to a laser.

BACKGROUND ART

Conventionally, a laser beam is used for cutting a workpiece. At that time, by increasing the peak output while making the duration (pulse width) of the laser beam pulse shorter than nanoseconds, it is possible to cut the workpiece with high accuracy without damaging the workpiece by heat. Therefore, pulsed laser beam having the pulse width shorter than 1 nanosecond is preferably used for cutting.

Patent Literature 1 discloses a two-dimensional photonic-crystal surface-emitting laser capable of emitting a pulsed laser beam. This two-dimensional photonic-crystal surface-emitting laser includes an active layer and a two-dimensional photonic crystal. Here, the two-dimensional photonic crystal has a photonic crystal structure for forming an optical resonance state, that is, in a plate-shaped base material, regions (specifically, holes) having a refractive index different from that of the base material are arranged at a predetermined period. In this two-dimensional photonic-crystal surface-emitting laser, light within a predetermined frequency band is generated by supplying an electric current into the active layer. Of the light in this frequency band, the light having a frequency determined by the period resonates in the two-dimensional photonic crystal, is amplified, and is emitted. At that time, the pulsed laser beam is emitted by repeatedly switching on and off the electric current supplied into the active layer (laser beam is continuously emitted when the electric current supply to the active layer is continued without interruption).

CITATION LIST

Patent Literature

Patent Literature 1: JP 2018-144664 A

SUMMARY OF INVENTION

Technical Problem

In a pulsed laser beam source, generally, the higher the time average output and the smaller the pulse width, the higher the peak output can be. The two-dimensional photonic-crystal surface-emitting laser is superior in that the time average output is higher than that of a normal semiconductor laser called an end face emitting type. On the other hand, in the conventional two-dimensional photonic-crystal surface-emitting laser, the pulse width is a minimum of several nanoseconds (the maximum pulse repetition frequency is several hundred MHz: Patent Literature 1), and is less likely to be shorter than 1 nanosecond. This is because the switching of the conventional two-dimensional photonic-crystal surface-emitting laser is performed by switching on and off the electric current that is supplied into the active layer, and it is difficult to make the response time shorter than 1 nanosecond.

An object to be solved by the present invention is to provide a two-dimensional photonic-crystal surface-emitting laser capable of emitting a pulsed laser beam having a pulse width shorter than 1 nanosecond and a high peak output.

Solution to Problem

In order to solve the above problems, according to the present invention, there is provided a two-dimensional photonic-crystal surface-emitting laser including:

a) an active layer;
b) a two-dimensional photonic crystal containing a base material having a plate shape and arranged on one side of the active layer and different refractive index portions arranged at lattice points of a predetermined lattice in the base material and having a refractive index different from that of the base material, a band edge frequency for each position in an electric current supply region, which is at least a part of the two-dimensional photonic crystal, is monotonically increased in one direction parallel to the base material; and
c) an electrode configured to supply an electric current into the active layer and the electric current supply region.

The different refractive index portion may be made of a member having a refractive index different from that of the base material, or may be a hole. In the former case, the refractive index ($n_m$) of the different refractive index portion (that is, the member) may be lower or higher than the refractive index ($n_b$) of the base material. In the latter case, the refractive index $n_m$ of the different refractive index portion (hole) is lower than the refractive index $n_b$ of the base material.

The frequency of light amplified in the two-dimensional photonic crystal has a value corresponding to the energy called a band edge, which is a boundary between a photonic band and a photonic band gap of the two-dimensional photonic crystal. This frequency is called the band edge frequency. The band edge frequency is larger as the effective refractive index experienced by light in the two-dimensional photonic crystal is smaller and/or the period length (lattice constant) of the lattice in which the different refractive index portion is arranged is smaller. In the case of $n_m<n_b$, the larger the filling factor, which is defined by the ratio of the volume occupied by a different refractive index portion in a unit lattice constituting the lattice, the smaller the effective refractive index, and in the case of $n_m>n_b$, the smaller the filling factor, the smaller the effective refractive index. Therefore, in the case of $n_m<n_b$, the term "a band edge frequency for each position in an electric current supply region is monotonically increased in one direction parallel to the base material" can be realized by monotonically increasing the filling factor in the electric current supply region in one direction, and in the case of $n_m>n_b$, it can be realized by monotonically decreasing the filling factor in the electric current supply region in the one direction. Further, regardless of the relationship between $n_m$ and $n_b$, even in a case where the period length is monotonically decreased in the electric current supply region in the one direction, it is possible to realize that "a band edge frequency for each position in an electric current supply region is monotonically increased in one direction parallel to the base material". Furthermore, an increase (in the case of $n_m<n_b$) or a decrease (in the case of $n_m>n_b$) in the filling factor and a decrease in the period length may be combined.

The operation of the two-dimensional photonic-crystal surface-emitting laser according to the present invention is described. When an electric current is supplied into the electric current supply region of the active layer and the two-dimensional photonic crystal, light within a predetermined frequency band is generated from the active layer, and at each position in the electric current supply region, the light at the band edge frequency corresponding to the band edge energy is amplified. Here, at the position where the band edge frequency is the largest, the frequency of the amplified light corresponds to the energy within the photonic band gap at another position, so that the effect of confining the light is the highest at that position. As a result, laser oscillation occurs at around the position where the band edge frequency is the highest. At the position where the laser oscillation occurs, the carriers are rapidly consumed and the number decreases, so that the effective refractive index increases. This increase in the effective refractive index has an effect of reducing the band edge frequency in the vicinity of the position where the band edge frequency is the largest, thereby reducing the overall difference among the band edge frequencies in the electric current supply region. As a result, the range in which laser oscillation occurs in the electric current supply region expands, and the output of the laser beam increases. Then, the carriers decrease over a wider range, and the laser oscillation stops. By the operation up to this point, one pulse of the pulsed laser beam is emitted. After that, the amount of carriers is recovered by supplying an electric current, and the pulsed laser beam is repeatedly emitted by the same operation as described above.

According to the calculation performed by the present inventors, when electric currents of 10 to 12 A are supplied in the two-dimensional photonic-crystal surface-emitting laser according to the present invention, the pulse frequency exceeds 1 GHz and the pulse width is shorter than 1 nanosecond, and thus it is possible to emit a pulsed laser beam having a peak output of 40 to 80 W, which is higher than that in a case of supplying the same electric current in a conventional two-dimensional photonic-crystal surface-emitting laser. Since such a pulsed laser beam is emitted while continuously supplying the electric current to the active layer, there is no need of switching on and off the electric current in the two-dimensional photonic-crystal surface-emitting laser according to the present invention, where the switching was the cause of preventing the pulse width from being shorter than 1 nanosecond in the conventional two-dimensional photonic-crystal surface-emitting laser.

The configuration in which the filling factor is monotonically increased (in the case of $n_m < n_b$) or decreased (in the case of $n_m > n_b$) in one direction parallel to the base material can be embodied by that the planar area of each different refractive index portion (hereinafter, simply referred to as "area") is monotonically increased (in the case of $n_m < n_b$) or decreased (in the case of $n_m > n_b$) in the above one direction. Alternatively, it can also be embodied by monotonically increasing (in the case of $n_m < n_b$) or decreasing (in the case of $n_m > n_b$) the depth of the different refractive index portion in the one direction. Further, by adjusting both the area and the depth, the volume of the different refractive index portion may be monotonically increased (in the case of $n_m < n_b$) or decreased (in the case of $n_m > n_b$) in the one direction. In order to make the different refractive index portion have a different depth for each position, it is necessary to adjust the etching time of the base material for each position at the time of fabrication; whereas, since such adjustment is not necessary to make the area different for each position, it is preferable that the area of each different refractive index portion is monotonically increased (in the case of $n_m < n_b$) or decreased (in the case of $n_m > n_b$) in the one direction.

The band edge frequency may be continuously increased in the one direction in the electric current supply region, or may be increased in a stepwise manner. The configuration where the band edge frequency is continuously increased can be embodied by continuously increasing the filling factor (in the case of $n_m < n_b$) or decreasing (in the case of $n_m > n_b$) toward one direction, or by continuously decreasing the period length (one cycle at a time). The configuration in which the band edge frequency is increased stepwise can be embodied by arranging a plurality of sets made of a plurality of different refractive index portions having the same filling factor toward the one direction and monotonically increasing (in the case of $n_m < n_b$) or decreasing (in the case of $n_m > n_b$) the filling factor for each set toward the one direction, or by arranging a plurality of sets made of different refractive index portions for a plurality of cycles having the same period length toward the one direction and decreasing the period length for each set toward the one direction. The number of steps of the stepwise increase may be a minimum of two steps, or may be three or more steps. In order to oscillate more stable pulsed laser beam, it is preferable that the band edge frequency is continuously increased in the one direction. On the other hand, in terms of facilitating design and fabrication, it is preferable that the band edge frequency is increased stepwise in the above one direction. In this case as well, an increase (in the case of $n_m < n_b$) or a decrease (in the case of $n_m > n_b$) in the filling factor and a decrease in the period length may be combined.

It is desirable that the different refractive index portion has a non-circular planar shape. As a result, it is possible to obtain a single-peak laser beam having the highest central intensity in a cross section perpendicular to the beam. Examples of a non-circular planar shape include polygons such as triangles and ellipses. Further, a group of different refractive index portions, which is a group consisting of two or more parts having different planar shapes or areas and different refractive indexes from the base material, is regarded as one different refractive index portion, and the different refractive index group may be arranged at the lattice point.

Advantageous Effects of Invention

According to the present invention, it is possible to obtain a two-dimensional photonic-crystal surface-emitting laser capable of emitting a pulsed laser beam having a pulse width shorter than 1 nanosecond and a high peak output.

DESCRIPTION OF EMBODIMENTS

An embodiment of a two-dimensional photonic-crystal surface-emitting laser according to the present invention will be described with reference to FIGS. 1A to 19.

Figure 1A:
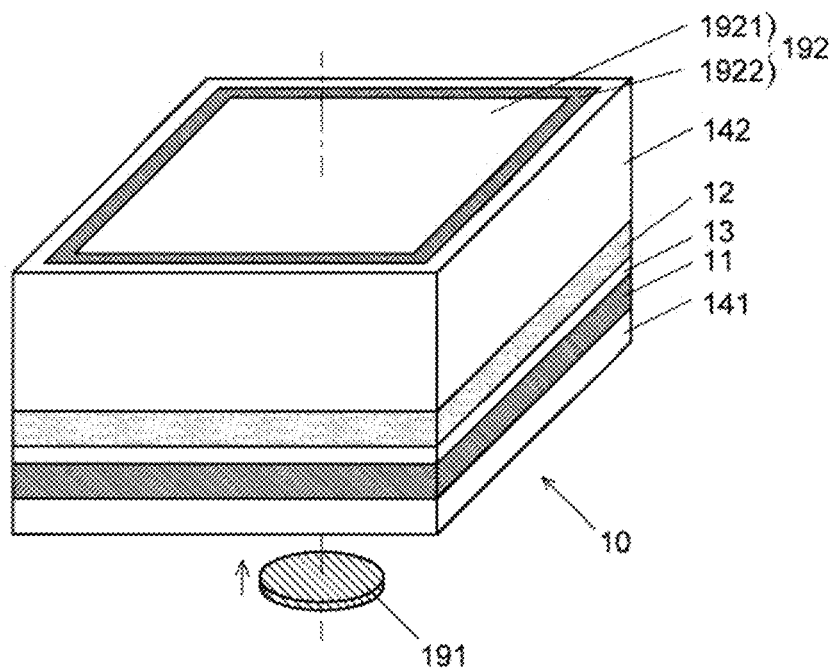
FIG. 1A is a perspective view illustrating an embodiment of a two-dimensional photonic-crystal surface-emitting laser according to the present invention.

(1) Configuration of Two-Dimensional Photonic-Crystal Surface-Emitting Laser of the Present Embodiment As illustrated in FIG. 1A, a two-dimensional photonic-crystal surface-emitting laser 10 of the present embodiment has a configuration in which a first electrode 191, a first cladding layer 141, an active layer 11, a spacer layer 13, a photonic crystal layer (two-dimensional photonic crystal) 12, a second cladding layer 142, and a second electrode 192 are sequentially stacked in the above-described order. However, the order of the active layer 11 and the photonic crystal layer 12 may be opposite to that described above. In FIG. 1, for convenience, the first electrode 191 is illustrated as a lower side, and the second electrode 192 is illustrated as an upper side, but the orientation of the two-dimensional photonic-crystal surface-emitting laser 10 at the time of use is not limited to that illustrated in FIG. 1. In FIG. 1, for convenience, the first electrode 191 is separated from other components, but is actually in contact with the lower surface of the first cladding layer 141.

The configurations of the layers and the electrodes are described below. First, the configurations other than the photonic crystal layer 12 are described, and then the configuration of the photonic crystal layer 12 is described in detail.

The active layer 11 emits light within a specific wavelength band upon receiving electric charges supplied from the first electrode 191 and the second electrode 192. As the material of the active layer 11, for example, an InGaAs/AlGaAs multiple quantum well (emission wavelength band: 935 to 945 nm) can be used.

The spacer layer 13 is not an essential component in the present invention, but is provided to connect the active layer 11 and the photonic crystal layer 12 of different materials. The material of the spacer layer 13 can be appropriately determined depending on the materials of the active layer 11 and the photonic crystal layer 12. For example, when the material of the active layer 11 is an InGaAs/AlGaAs multiple quantum well and the material of the base material 121 (described later) of the photonic crystal layer 12 is GaAs, GaAs or AlGaAs can be preferably used as the material of the spacer layer 13.

The first cladding layer 141 and the second cladding layer 142 connect the first electrode 191 and the active layer 11, and the second electrode 192 and the photonic crystal layer 12, supply an electric current from the first electrode 191 and the second electrode 192 into the active layer 11, and have a role of confining light in the vicinity of the active layer 11 due to a difference in refractive index from the active layer 11. In order to play these roles, a p-type semiconductor having a refractive index lower than that of the active layer 11 is used as a material of the first cladding layer 141, and an n-type semiconductor having a refractive index lower than that of the active layer 11 is used as a material of the second cladding layer 142. For example, the first cladding layer 141 can be configured as a two-layer structure of a layer made of p-GaAs and a layer made of p-AlGaAs in order from the first electrode 191 side, and similarly, the second cladding layer 142 can be configured as a two-layer structure of a layer made of n-GaAs and a layer made of n-AlGaAs in order from the second electrode 192 side (a two-layer structure is not illustrated in either case).

The first electrode 191 is a plate-shaped member made of a metal opaque to the laser beam generated by the two-dimensional photonic-crystal surface-emitting laser 10. The area of the first electrode 191 is smaller than the area of the active layer 11. A reflection layer (not illustrated) made of metal opaque to laser beam is provided around the first electrode 191 via an insulator between the reflection layer and the first electrode 191. The reflection layer has a role of reflecting the laser beam generated inside the two-dimensional photonic-crystal surface-emitting laser 10 together with the first electrode 191 and emitting the laser beam from the second electrode 192 side to the outside. The planar shape of the first electrode 191 is circular in the present embodiment, but other shapes may be used.

The second electrode 192 has a configuration in which the center of a square plate-shaped member made of metal opaque to laser beam is hollowed out in a square shape. A portion where the plate-shaped member is hollowed out is referred to as a window portion 1921, and a portion where the plate-shaped member is left is referred to as a frame portion 1922. The plate-shaped member has an area larger than that of the first electrode 191. As the second electrode 192, instead of having such a window portion, a plate-shaped electrode made of a conductive material (for example, indium tin oxide) transparent to the laser beam may be used. The planar shape of the plate-shaped member is square in this embodiment, but other shapes may be used.

The thickness of the second cladding layer 142 is sufficiently larger than the thicknesses of the active layer 11, the photonic crystal layer 12, the spacer layer 13, and the first cladding layer 141. As a result, the planar shape of the electric current supply region 120 (refer to FIG. 2) which is the region in which the electric current is supplied in the active layer 11 and the photonic crystal layer 12 is circular, which is substantially equal to that of the first electrode 191 and the size of the electric current supply region 120 is slightly larger than that of the first electrode 191. The size of the electric current supply region 120 is not limited to the above example, and may be the same as the photonic crystal layer 12 or may be smaller than the photonic crystal layer 12 (including the above example). In the latter case, since the portion of the photonic crystal layer 12 outside the electric current supply region 120 has a small influence on the laser oscillation, the configuration of the photonic crystal layer 12 in the electric current supply region 120 will be described below.

Figure 1B:
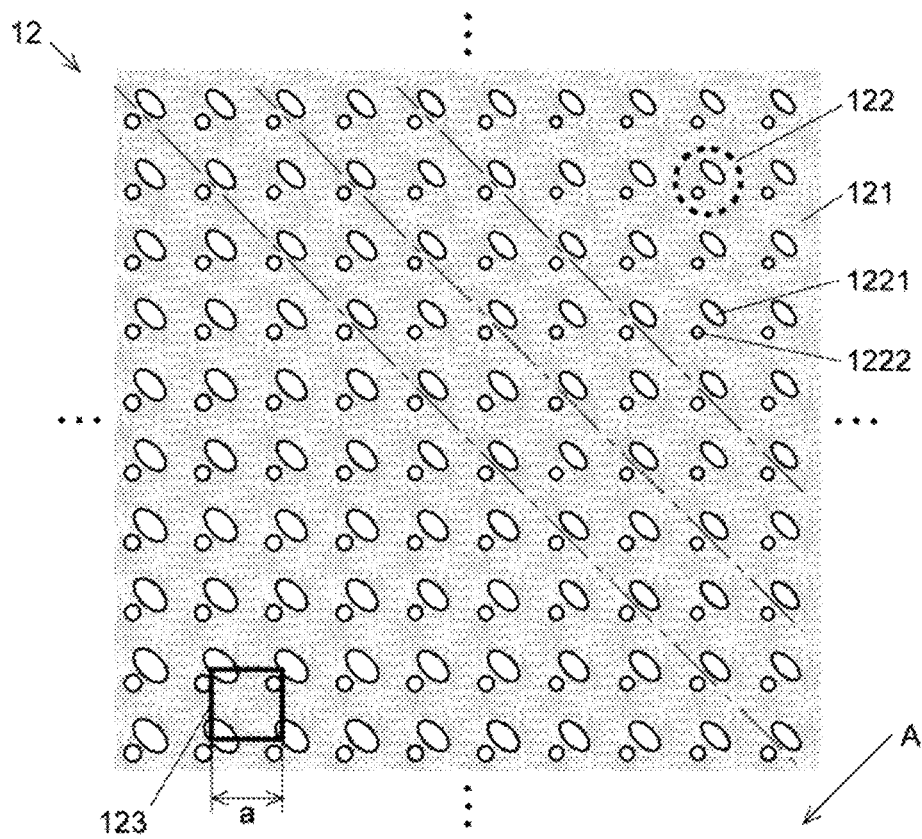
FIG. 1B is a plan view of a photonic crystal layer (two-dimensional photonic crystal) included in the two-dimensional photonic-crystal surface-emitting laser.
Figure 2:
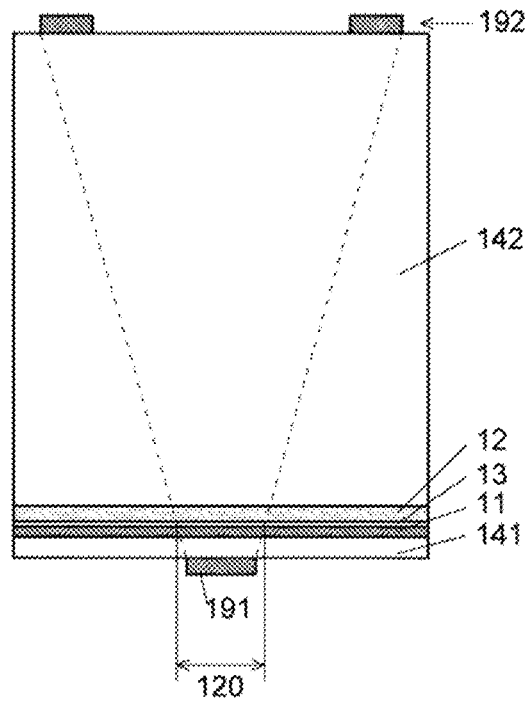
FIG. 2 is a diagram illustrating an electric current supply region in the two-dimensional photonic-crystal surface-emitting laser of the present embodiment.

As illustrated in FIG. 1B, the photonic crystal layer 12 has a plate-shaped base material 121 and a different refractive index portion 122 arranged in a square lattice pattern (at the lattice points of the square lattice) in the base material 121. For example, GaAs can be used as the material of the base material 121. In the present embodiment, each of the different refractive index portions 122 corresponds to the different refractive index portion group in which a main different refractive index portion 1221 and a sub-different refractive index portion 1222, which have different planar shapes and areas from each other, are combined. The planar shapes of the main different refractive index portion 1221 and the sub-different refractive index portion 1222 are elliptical in the former and circular in the latter, but other shapes may be used. In the present embodiment, both the main different refractive index portion 1221 and the sub-different refractive index portion 1222 are made of holes provided in the base material 121. In this case, the refractive index $n_m$ of the different refractive index portion 122 is lower than the refractive index $n_b$ of the base material 121 (that is, $n_m < n_b$). Instead of the holes, the different refractive index portion 122 may be formed by embedding a member made of a substance having a refractive index lower ($n_m < n_b$) or higher ($n_m > n_b$) than the base material 121 in the base material 121.

Each of the different refractive index portions 122 is not limited to the above-mentioned examples, and may have only one portion, or may have three or more portions having a refractive index different from that of the base material 121. When there is only one portion having a different refractive index from the base material 121, for example, the planar shape may be a right triangle (FIG. 3), a triangle other than the right triangle, a polygon other than the triangle, an ellipse, and the like. The planar shapes of the different refractive index portions 122 illustrated so far are all non-circular. By using the different refractive index portions 122 having such a non-circular planar shape, the two-dimensional photonic-crystal surface-emitting laser 10 performs laser oscillation with a single peak type emission beam in the direction perpendicular to the photonic crystal layer 12. Here, the different refractive index portion 122 having a circular planar shape may be used in the present invention.

The period length of the square lattice on which the different refractive index portion 122 is arranged may be about the same as the wavelength of the laser beam to be oscillated in the photonic crystal layer 12. Specifically, when oscillating a laser beam having a wavelength in vacuum (the wavelength in air is almost the same) of $\lambda_0$, a period length a may be $a = \lambda_0 / n_{eff}$, which is a value obtained by dividing $\lambda_0$ by the effective refractive index $n_{eff}$ (determined by materials of the base material 121 and the different refractive index portion 122, and the area ratio occupied by the different refractive index portion 122 in the photonic crystal layer 12) experienced by light in the photonic crystal layer 12. The lattice points on which the different refractive index portions 122 are arranged are not limited to a square lattice, and may be a triangular lattice, a rectangular lattice, or the like.

Figure 3:
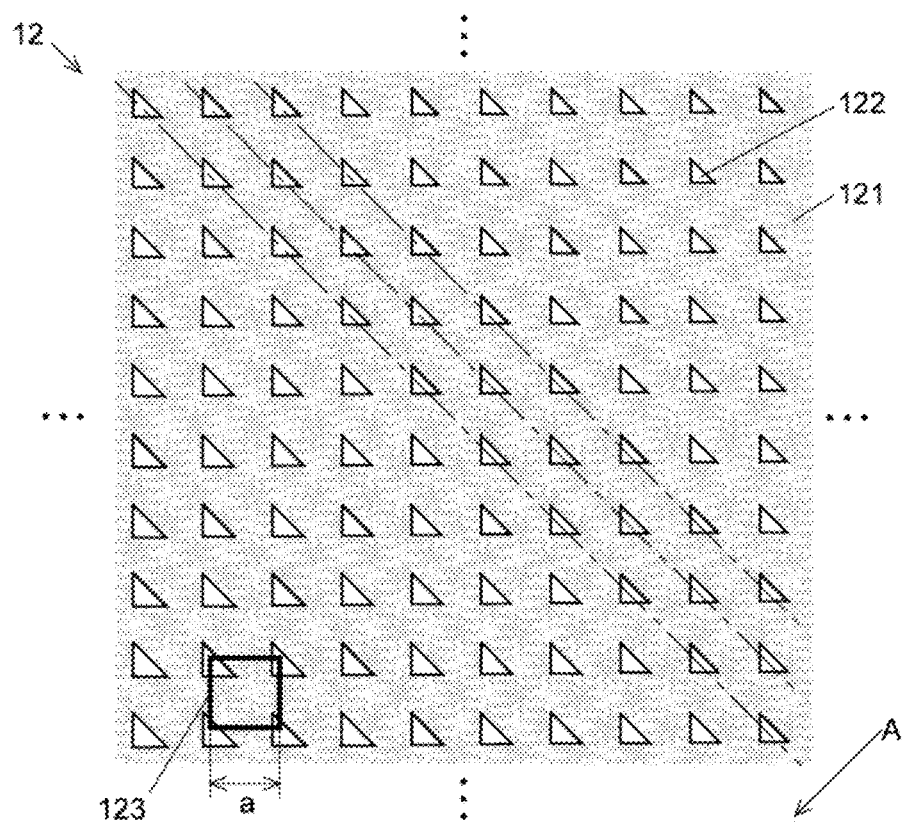
FIG. 3 is a plan view illustrating another example of a photonic crystal layer in the two-dimensional photonic-crystal surface-emitting laser of the present embodiment.
Figure 4:
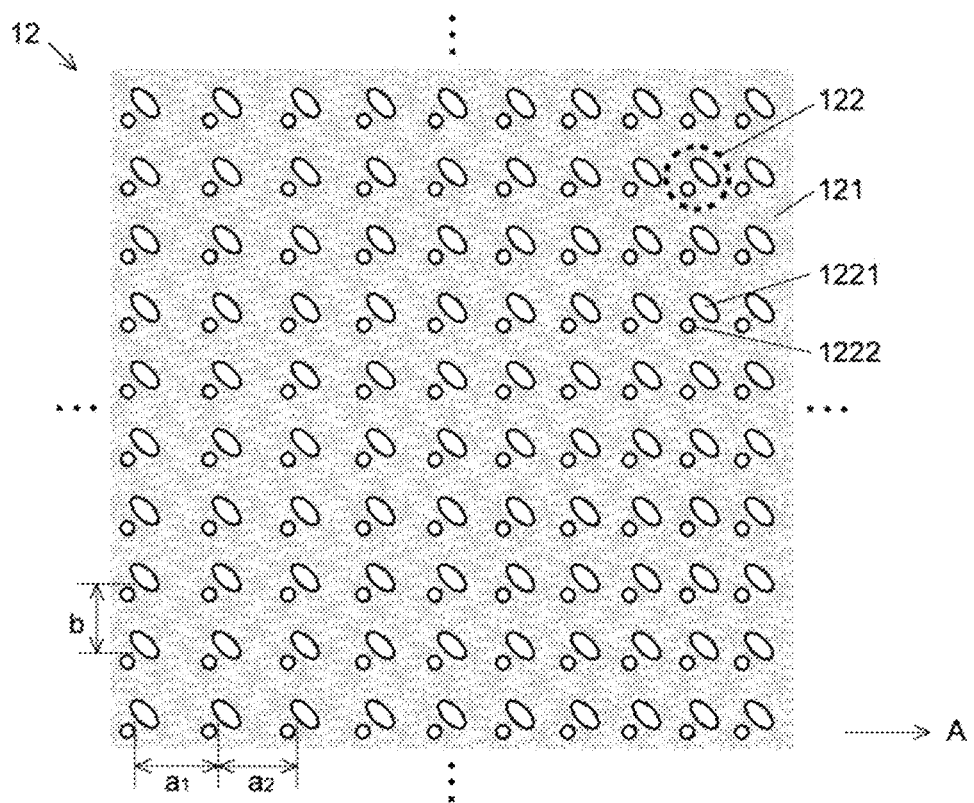
FIG. 4 is a plan view illustrating another example of a photonic crystal layer in the two-dimensional photonic-crystal surface-emitting laser of the present embodiment.
Figure 5:
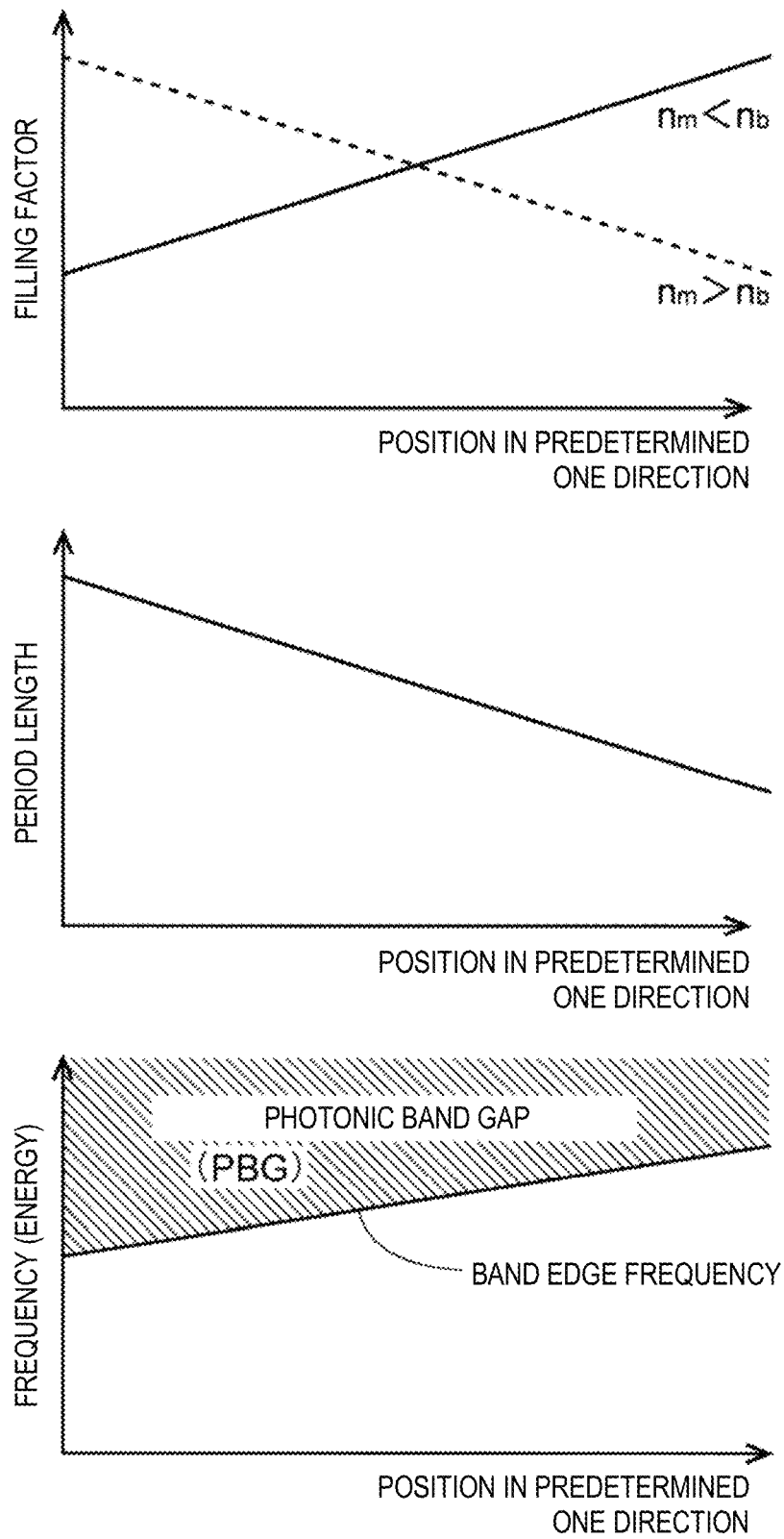
FIG. 5 shows graphs illustrating a difference in a filling factor depending on a position in a photonic crystal layer (upper drawing), a difference in a period length (middle drawing), and a difference in a band edge frequency caused by the aforementioned differences in the two-dimensional photonic-crystal surface-emitting laser of the present embodiment (lower drawing).
Figure 6:
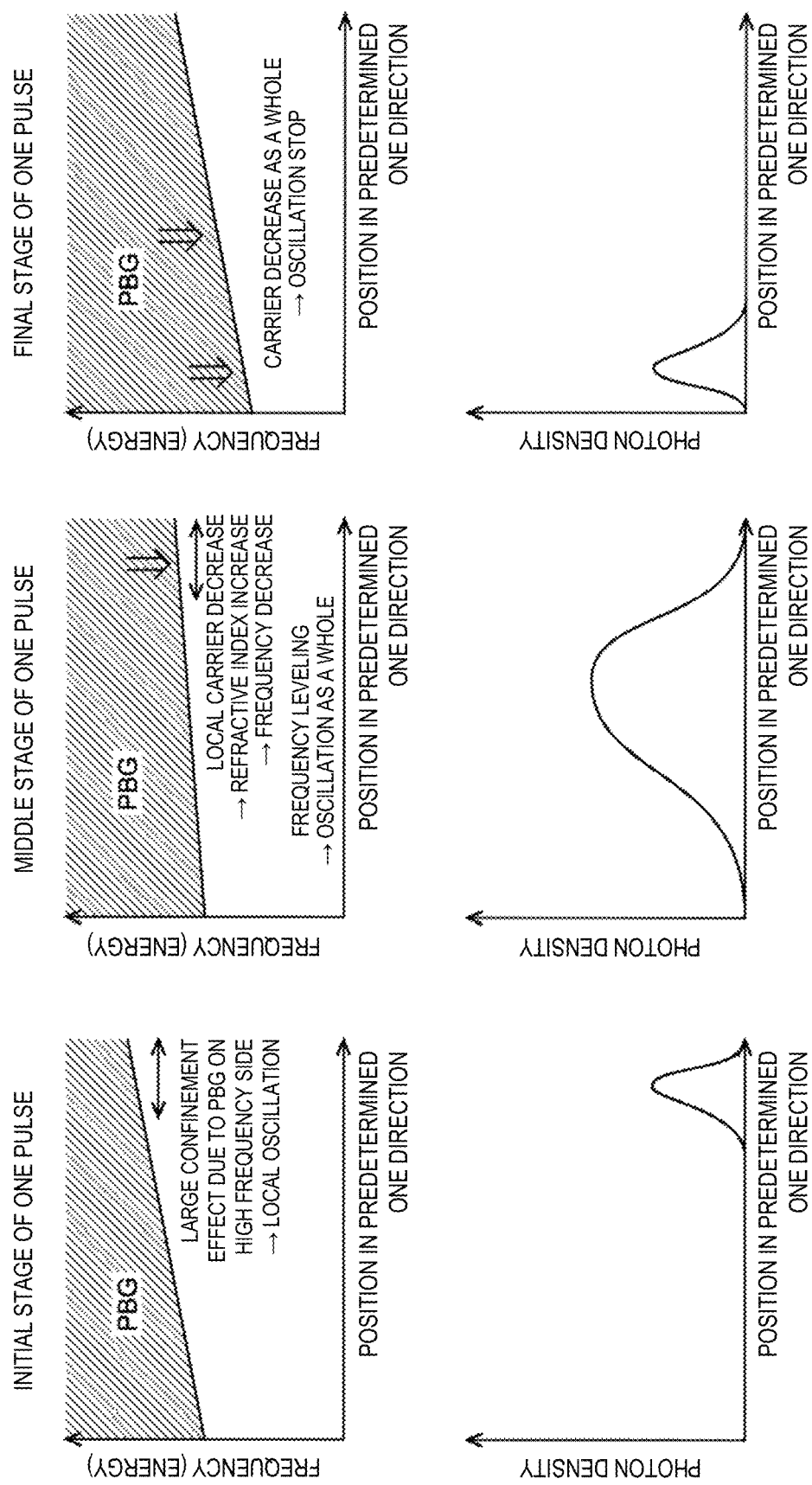
FIG. 6 shows diagrams illustrating an operation of pulsed laser oscillation in examples of FIG. 5, and are graphs illustrating a difference in band edge frequency and photon density depending on a position in the photonic crystal layer at an initial stage, a middle stage, and a final stage of one pulse.

The filling factor (FF) in the photonic crystal layer 12 having $n_m < n_b$ in the electric current supply region 120 illustrated in FIGS. 1B and 3 is described in what follows. The FF is defined by a ratio of the volume occupied by the different refractive index portion 122 in the unit lattice 123 constituting the lattice of lattice points (square lattice in the examples of FIGS. 1B and 3) in which the different refractive index portion 122 are arranged. When the different refractive index portion 122 is columnar and the depth of each different refractive index portion 122 is the same, the FF is equal to the ratio of the area occupied by the different refractive index portion 122.

The plurality of different refractive index portions 122 arranged in the direction inclined by 45° with respect to the square lattice shown by the alternate long and short dash line in FIGS. 1B and 3 have the same area as each other. The areas of these different refractive index portions 122 are monotonically increased toward the direction (this direction is inclined 45° with respect to the square lattice as well) perpendicular to the alternate long and short dash line shown by the arrow A from the upper right to the lower left in FIGS. 1B and 3. On the other hand, the area of the unit lattice is equal regardless of the position. Therefore, the FF in the photonic crystal layer 12 is increased monotonically in the direction of the arrow A, which is one direction parallel to the base material 121.

In these examples, in any of the different refractive index portions 122, a different refractive index portion 122 adjacent in the direction of the arrow A has an area larger than or equal to the area of the different refractive index portion 122. However, in at least a part of the different refractive index portions 122, the different refractive index portion 122 adjacent in the direction of the arrow A has a larger area (not equal) than the different refractive index portion 122. In all the different refractive index portions 122, the configuration in which the different refractive index portion 122 adjacent to the direction of the arrow A has a larger area corresponds to the one in which FF is continuously increased. On the other hand, the configuration in which the different refractive index portion 122 adjacent to the direction of the arrow A has the same area in a part of the different refractive index portions 122 corresponds to the one in which FF is continuously increased.

FIG. 1B and FIG. 3 exaggeratingly illustrate that the area of the different refractive index portion 122 is increased in the direction of the arrow A. As for the actual photonic crystal layer 12, for example, in the example described in the calculation described later, the difference in the area of the different refractive index portions 122 separated by several thousand pieces (thousands×$2^{1/2}$ times the period length of the square lattice) in the direction of the arrow A is set to be less than 1% or less than 0.1%.

The configuration for monotonically increasing the FF in one direction may be one for monotonically increasing the depth of the different refractive index portion 122 in one direction, in addition to one for monotonically increasing the area of the planar shape of the different refractive index portion 122 described above in one direction. The volume of the different refractive index portion 122 may be monotonically increased in one direction by combining the area and the depth of the planar shape.

In the above example, when $n_m < n_b$ in the electric current supply region 120, the FF of the different refractive index portion 122 is monotonically increased in a predetermined direction; however, when $n_m > n_b$ in the electric current supply region 120, the FF of the different refractive index portion 122 can be monotonically decreased in a predetermined direction by the same method. For example, when the FF of each different refractive index portion 122 is set as illustrated in FIGS. 1B and 3, the FF is monotonically decreased in the direction opposite to the arrow A.

Instead of the FF of the different refractive index portion 122 described in the above example, or together with the FF, the period length (lattice constant) of the lattice in which the different refractive index portion 122 is arranged in the electric current supply region 120 may be monotonically decreased in a predetermined one direction. In the example illustrated in FIG. 4, period lengths $a_1$, $a_2$ . . . are monotonically decreased in the direction of the arrow A (from left to right) in the drawing. The period length b in the direction perpendicular to the arrow A (vertical direction in the drawing) is the same regardless of the position. In this example, the period length in the direction of the arrow A is continuously decreased, but it may be decreased stepwise.

The difference in the FF and the period length depending on the position in the photonic crystal layer 12 described above may be formed in the electric current supply region 120, and may not be formed outside the electric current supply region 120 (may be formed outside the electric current supply region 120).

(2) Operation of Two-Dimensional Photonic-Crystal Surface-Emitting Laser of the Present Embodiment An operation of the two-dimensional photonic-crystal surface-emitting laser 10 of the present embodiment will be described. By applying a predetermined voltage between the first electrode 191 and the second electrode 192, an electric current is supplied into the active layer 11 from both electrodes. At this time, since the area of the second electrode 192 is larger than that of the first electrode 191, in the active layer 11 and the photonic crystal layer 12, a current (charge) is intensively supplied into the electric current supply region 120 which is a range narrower than the second electrode 192 and wider than the first electrode 191 (refer to FIG. 2). As a result, light emission having a frequency within a predetermined frequency band is generated from the active layer 11, and the light having a predetermined frequency is amplified and laser oscillated in the electric current supply region 120 of the photonic crystal layer 12 as described below.

A value of the frequency amplified in the photonic crystal layer 12 corresponds to energy called a band edge, which is a boundary between a photonic band and a photonic band gap (abbreviated as PBG in FIG. 6) of the two-dimensional photonic crystal. In the case of $n_m < n_b$, when the FF is monotonically increased in a predetermined direction (solid line in the upper drawing of FIG. 5), the band edge frequency is monotonically increased in that one direction (the same applies to the lower drawing). In contrast, in the case of $n_m > n_b$, when the FF is monotonically decreased in a predetermined direction (dashed line in the upper drawing of FIG. 5), the band edge frequency is monotonically increased in that one direction (the same applies to the lower drawing). On the other hand, regardless of the relationship between $n_m$ and $n_b$, when the period length is monotonically decreased in a predetermined direction (middle drawing in FIG. 5), the band edge frequency is monotonically increased in the one direction (the same applies to the lower drawing). In any of these cases, at the position (right end in FIG. 5) where the band edge frequency is the maximum value, since the band edge frequency corresponds to the energy in the photonic band gap at another position (left side in FIG. 5), the effect of the light confinement becomes the highest at that position (upper left drawing of FIG. 6). Therefore, first, the laser oscillation occurs in the vicinity of the position where the band edge frequency becomes the maximum value (the same applies to the lower left drawing).

Then, the refractive index is increased as the carriers are rapidly consumed and decreased in the vicinity of the position. This increase in the refractive index corresponds to a decrease in the band edge frequency in the vicinity of the position and a small difference in the band edge frequency in the photonic crystal layer 12 (upper and middle drawings in FIG. 6). As a result, the range in which laser oscillation occurs in the photonic crystal layer 12 is expanded, and the output of the laser beam is increased (the same applies to middle and lower drawings). Then, the carriers are decreased in a wider range (the same applies to upper right drawing), the range where the laser oscillation occurs and the output of the laser beam become smaller (the same applies to lower right drawing), and the laser oscillation stops. By the operation up to this point, one pulse of the pulsed laser beam is emitted. After that, the amount of carriers is recovered by supplying the electric current, a state returns to the state shown in the upper left drawing and the lower left drawing of FIG. 6, and the pulsed laser beam is repeatedly emitted by the same operation as described above.

The pulsed laser beam generated in the photonic crystal layer 12 in this way is diffracted in the direction perpendicular to the photonic crystal layer 12 and emitted from the window portion 1921 of the second electrode 192.

(3) Calculation and Experiment of Laser Oscillation in Two-Dimensional Photonic-Crystal Surface-Emitting Laser of the Present Embodiment The following shows the results of calculations for a plurality of examples having different configurations of the photonic crystal layer 12 in the two-dimensional photonic-crystal surface-emitting laser 10 of the present embodiment, and the results of experiments on one example.

First Calculation Example

In a first calculation example, as the photonic crystal layer 12, a layer in which double-hole type different refractive index portions 122 which are combinations of the main different refractive index portion 1221 having an elliptical planar shape and the sub-different refractive index portion 1222 having a circular planar shape, as illustrated in FIG. 1B, were arranged in a square lattice pattern was used. The period length (lattice constant of the square lattice) was 276 nm. The FF of each different refractive index portion 122 was set such that the electric current supply region 120 in the photonic crystal layer 12 was a circle with a diameter of 1 mm, and within that circle, the FF was continuously changed from the minimum value $FF_{min}=0.0750$ to the maximum value $FF_{max}=0.0755$ in the direction of the arrow A in FIG. 1B. Here, the difference between the maximum value $FF_{max}$ and the minimum value $FF_{min}$ of the FF in the electric current supply region 120 (hereinafter, FF in the electric current supply region 120 is simply referred to as "FF") is defined as $\Delta FF=(FF_{max}-FF_{min})$. In the first calculation example, $\Delta FF=0.0005$ (0.05%). In the photonic crystal layer 12 having the distribution of the FF in first calculation example, the maximum value of the band edge frequency in the electric current supply region 120 (hereinafter, the band edge frequency in the electric current supply region 120 is simply referred to as "band edge frequency") and $\delta f$, which is the value obtained by dividing the difference between the minimum values by the minimum value, is 0.007%. The ratio of the area of the main different refractive index portion 1221 and the area of the sub-different refractive index portion 1222 in each different refractive index portion 122 was set to 3:2 regardless of the value of FF.

Figure 7:
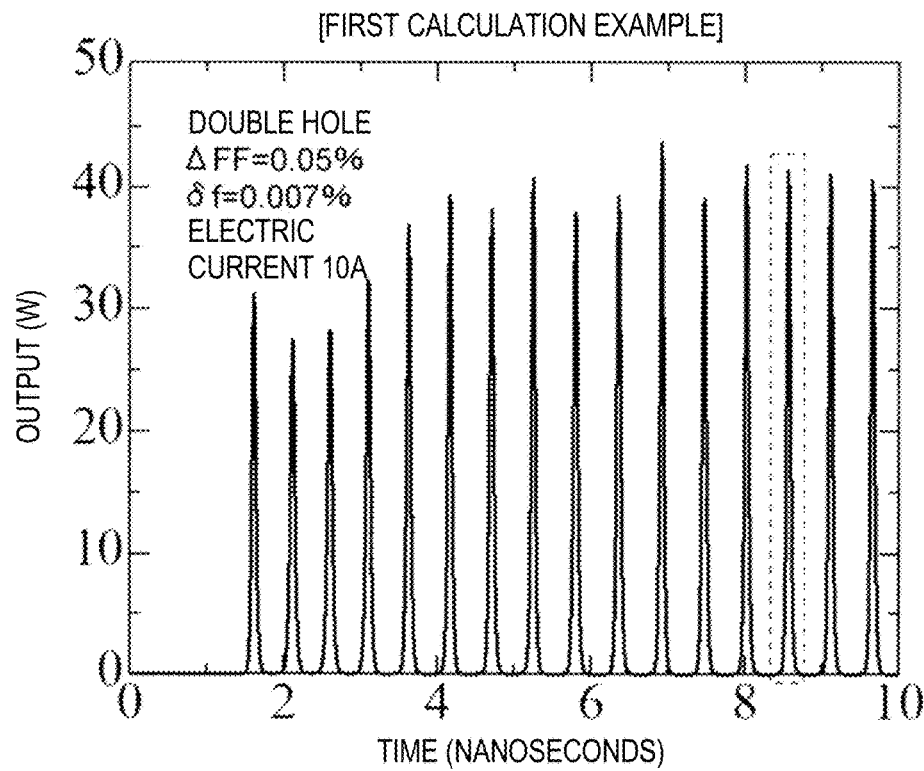
FIG. 7 is a graph illustrating a result obtained by calculating time change of an intensity of a laser beam emitted from the two-dimensional photonic-crystal surface-emitting laser of the present embodiment (First Calculation Example).

In the two-dimensional photonic-crystal surface-emitting laser 10 provided with such a photonic crystal layer 12, the time change of the intensity of the laser beam emitted when the electric current of 10 A is continuously supplied into the electric current supply region was obtained by calculation. FIG. 7 illustrates the results. Approximately 1.5 nanoseconds after the start of electric current supply, the first pulsed laser beam is emitted, and then the pulsed laser beam repeatedly oscillates at a period of approximately 0.5 nanoseconds. The pulse width per pulse is 0.057 nanoseconds in full width at half maximum.

Figure 8:
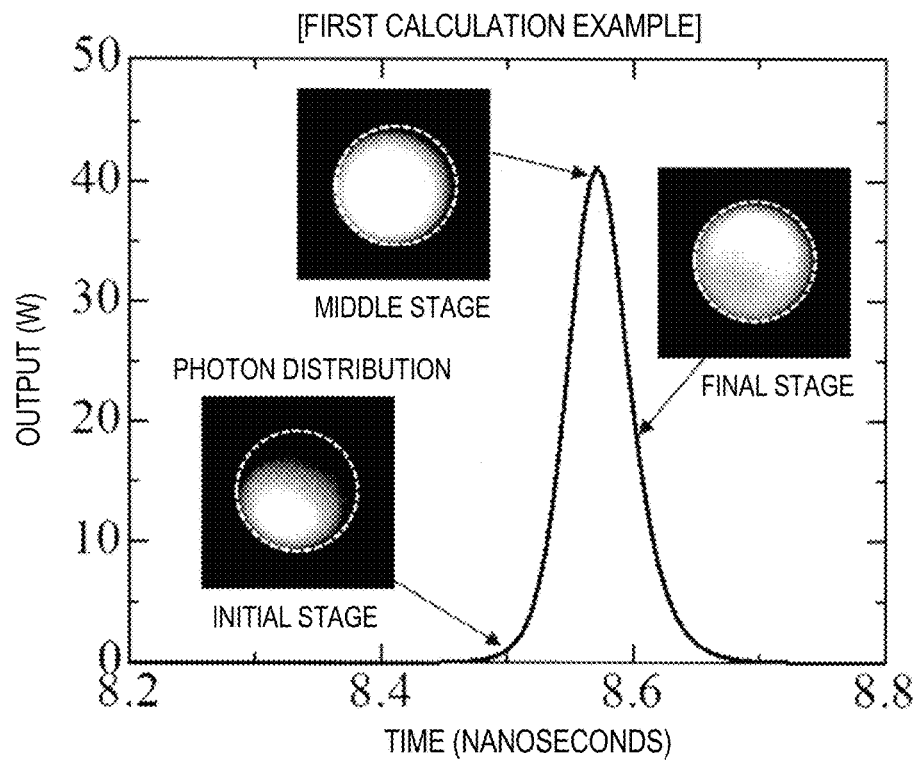
FIG. 8 is a diagram illustrating a part of the graph of FIG. 7 by enlarging a time (horizontal axis), and is a diagram illustrating a photon distribution in the electric current supply region of a photonic crystal layer at the initial, middle, and final stages of the pulse laser oscillation.

Among the plurality of pulses illustrated in FIG. 7, one of the pulses surrounded by a dashed line in the drawing is illustrated in FIG. 8 by enlarging a time (horizontal axis). FIG. 8 also illustrates each photon distribution in the electric current supply region of the photonic crystal layer 12 at the initial, middle, and final stages of oscillation of one pulse laser. In the diagram of the photon distribution, the inside of the dashed line circle is the electric current supply region and a region where the FF distribution is formed, and the FF distribution is formed so that the FF is increased from the upper right to the lower left in the circle. From the diagram of these photon distributions, in the initial stage, the laser oscillation occurs around the position in the vicinity of the lower left where FF is the largest, in the middle stage, the oscillation spreads over the entire electric current supply region to form a single peak, and in the last stage, the laser oscillation occurs around the position in the vicinity of the upper left where the FF is the largest.

Comparative Example

Figure 9:
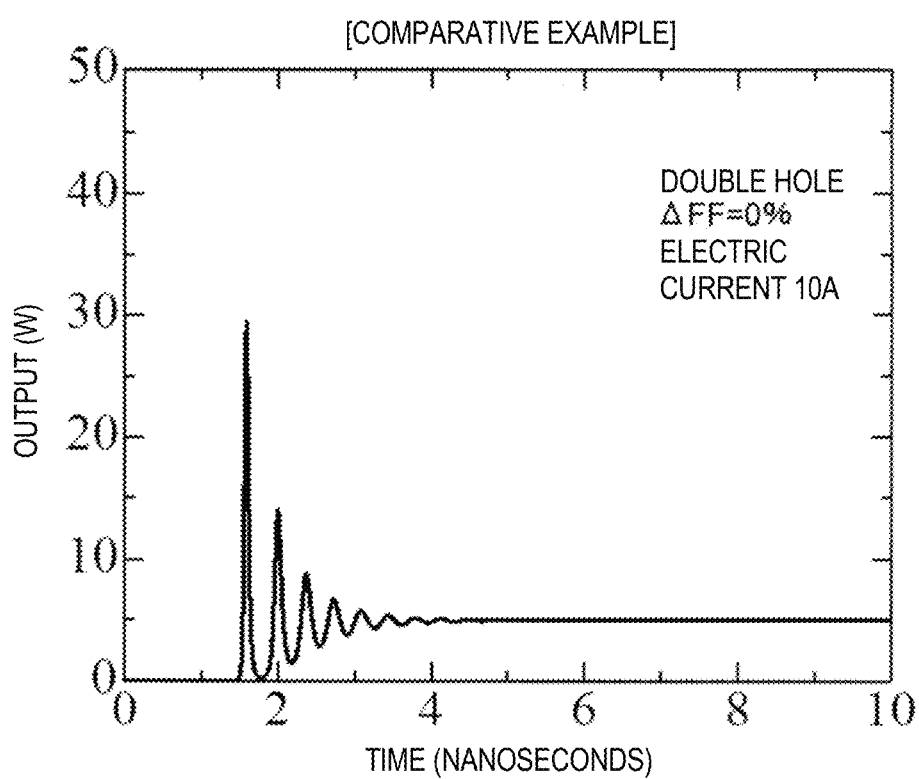
FIG. 9 is a graph illustrating a result obtained by calculating time change of an intensity of a laser beam emitted from the two-dimensional photonic-crystal surface-emitting laser of a comparative example.

As a comparative example, as for a two-dimensional photonic-crystal surface-emitting laser provided with a photonic crystal layer 12 having the same configuration as that of the first calculation example except for the fact that the FF of the double-hole type different refractive index portion 122 similar to that in FIG. 1B has the same value of 0.075 regardless of the position, the time change of the intensity of the laser beam emitted when the same electric current of 10 A as in the first calculation example was continuously supplied into the electric current supply region was obtained by calculation. FIG. 9 illustrates the results. As a result, although the intensity of the laser beam fluctuates slightly immediately after the start of electric current supply, after approximately 4 nanoseconds have passed, the laser oscillates continuously with a constant output of approximately 5 W. Therefore, if the electric current is continuously supplied in the configuration of the comparative example, the pulsed laser beam cannot be obtained.

Second Calculation Example

Figure 10:
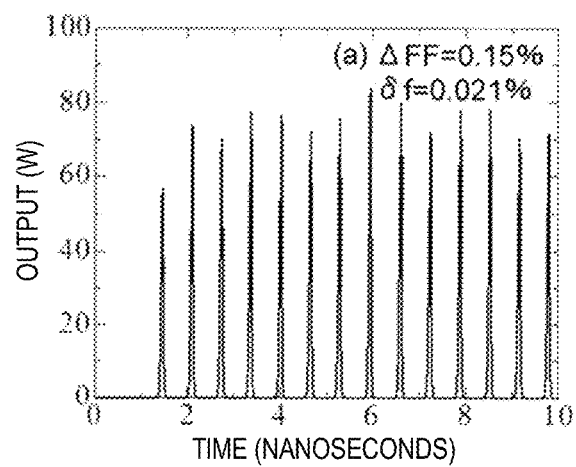
FIG. 10 shows graphs illustrating results obtained by calculating the time change of the intensity of the emitted laser beam in examples where a difference ΔFF between a maximum value and a minimum value of the filling factor is 0.15% (a), 0.20% (b), and 0.30% (c), respectively (Second Calculation Example).
Figure 10:
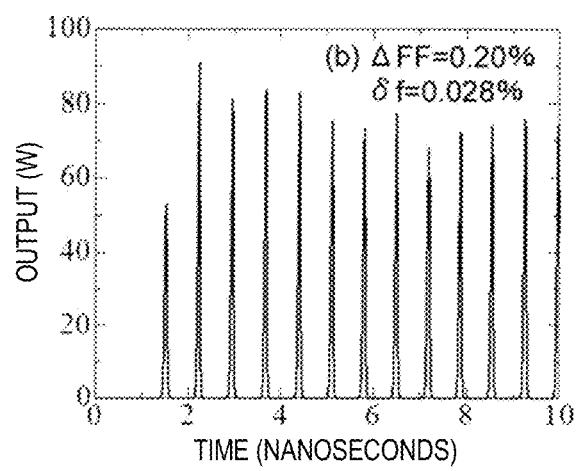
Figure 10:
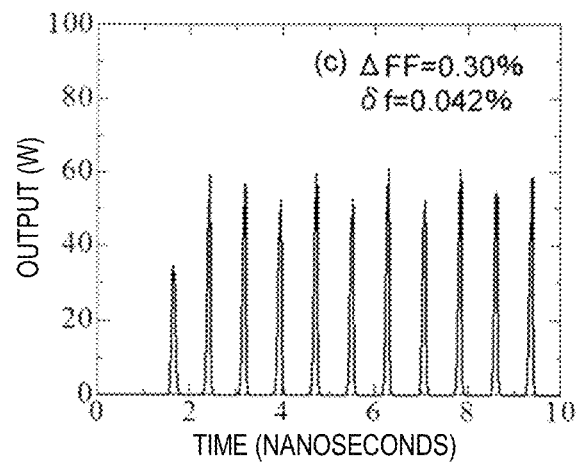

In the photonic crystal layer 12 including the double-hole type different refractive index portion 122 illustrated in FIG. 1B, the time change of the intensity of the laser beam was calculated for a case where $FF_{min}$ was set as 0.075, which is the same as in first calculation example, and $\Delta FF$ was set as (a) 0.0015 (0.15%), (b) 0.0020 (0.20%), and (c) 0.0030 (0.30%). In this calculation example, the period length was set as 276 nm, which is the same as in first calculation example, and the electric current supplied into the electric current supply region was set as 12 A. FIG. 10 illustrates the calculation results. In each example, the pulsed laser beam oscillates repeatedly. The pulse repetition period is the shortest when $\Delta FF$ is 0.0015, and becomes longer as $\Delta FF$ is increased to 0.0020 and 0.0030. As a peak intensity, a high value exceeding 80 W is obtained when $\Delta FF$ is 0.0015 and 0.0020.

Third Calculation Example

In the photonic crystal layer 12 including the double-hole type different refractive index portion 122 illustrated in FIG.

Figure 11:
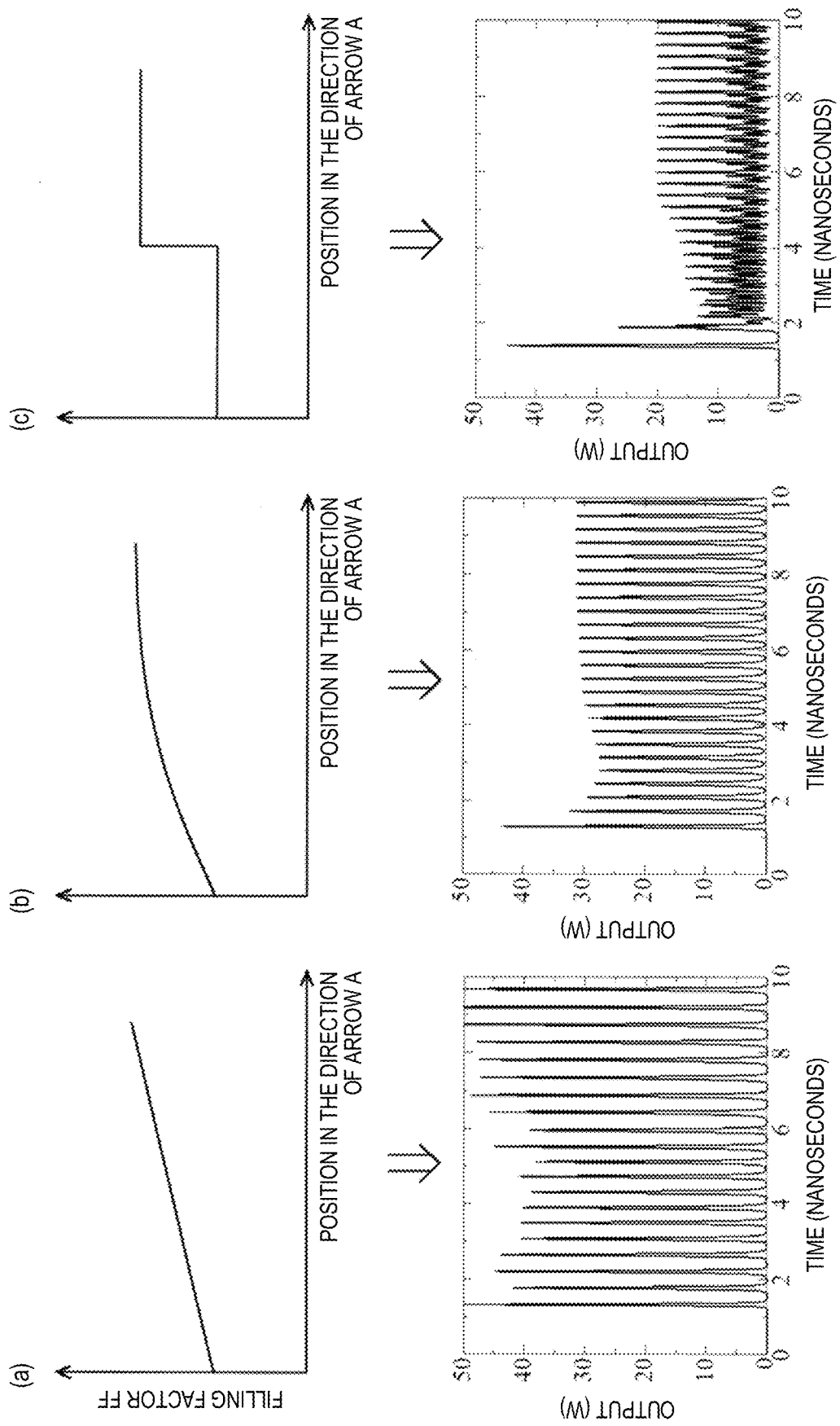
FIG. 11 shows graphs respectively illustrating results obtained by calculating the time change of the intensity of the emitted laser beam in cases where the filling factor changes continuously in one direction in a linear function (a), continuously in a quadratic function (b), and in a two-step stepwise (c) (Third Calculation Example).

1B, as illustrated in the upper part of FIG. 11, regarding the position in the one direction (direction of arrow A) parallel to the base material 121, the time change of the intensity of the laser beam was calculated for cases where the FF is changed continuously in one direction in a linear function (a), continuously in a quadratic function (b), and in a two-step stepwise (c). In each of (a) to (c), the period length was 276 nm, $FF_{min}$ was 0.075, $\Delta FF$ was 0.0005 (0.05%), and the electric current supplied into the electric current supply region was 12 A. The calculation results are illustrated in the lower part of FIG. 11. In all of (a) to (c), the pulsed laser beam oscillates repeatedly. In a one-pulse waveform, in the examples (a) and (b) where the FF is continuously changed with respect to the position, the minimum value of the output is decreased to 0 W; whereas, in the example of (c) where the FF is changed stepwise, the minimum value of the output is always larger than 0 W, which is in an intermediate state between pulse oscillation and continuous oscillation. This result indicates that stable pulsed laser oscillation can be obtained when the change of the FF with respect to the position is continuous rather than the change performed stepwise.

Fourth Calculation Example

Figure 12:
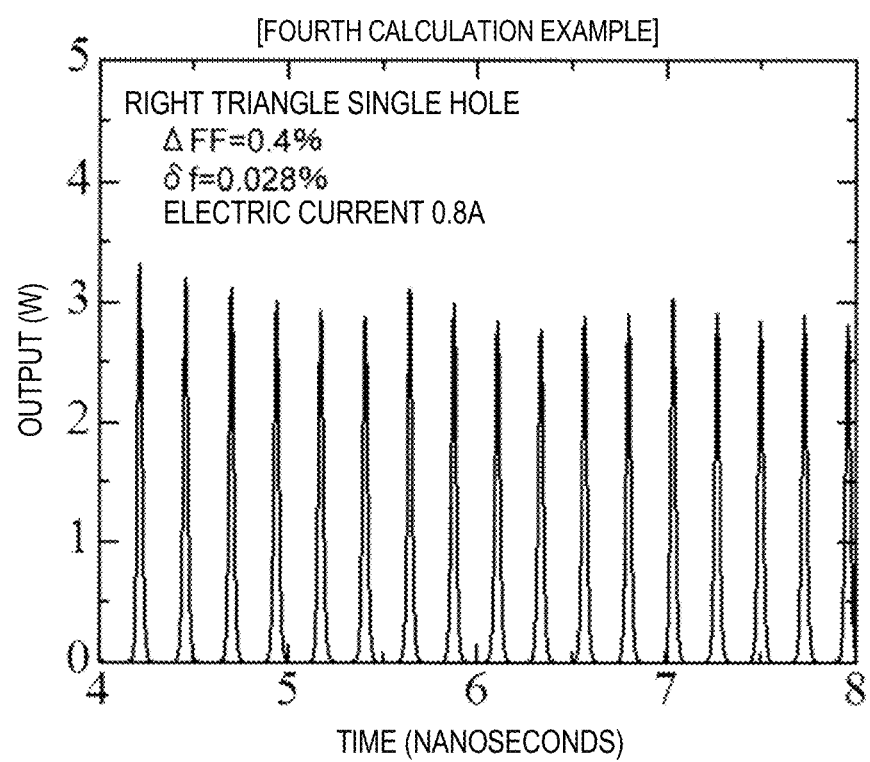
FIG. 12 is a graph illustrating the result obtained by calculating the time change of the intensity of the emitted laser beam in the example of the two-dimensional photonic-crystal surface-emitting laser including a single-hole type different refractive index portion made of one hole having a right triangle in a planar shape (Fourth Calculation Example).

The time change of the intensity of the laser beam of the two-dimensional photonic-crystal surface-emitting laser 10, provided with the photonic crystal layer 12 including the single-hole type different refractive index portion 122 made of one hole having a right triangle in a planar shape as illustrated in FIG. 3, was calculated. In this example, the electric current supply region was set as a circle with a diameter of 200 μm, the period length was set to 276 nm, $FF_{min}$ was set to 0.18, and $\Delta FF$ was set to 0.004 (0.4%). In this case, δf is 0.028%. FIG. 12 illustrates the calculation results. In this example, the pulsed laser beam oscillates repeatedly.

Fifth Calculation Example

Figure 13A:
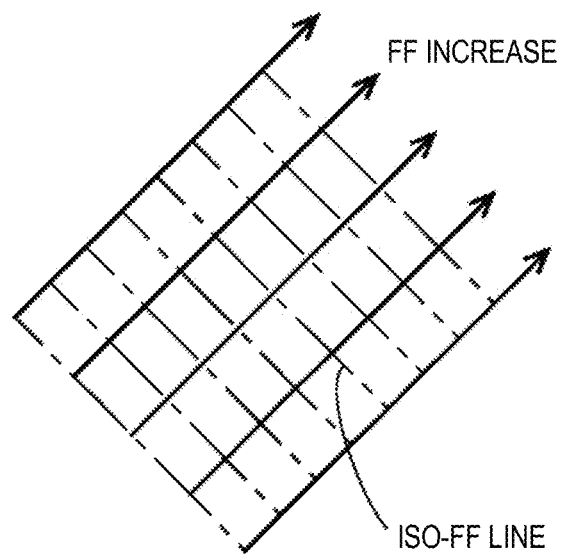
FIG. 13A is schematic diagram illustrating an example in which the filling factor is monotonically increased in one direction inclined by 45° with respect to a square lattice.
Figure 13B:
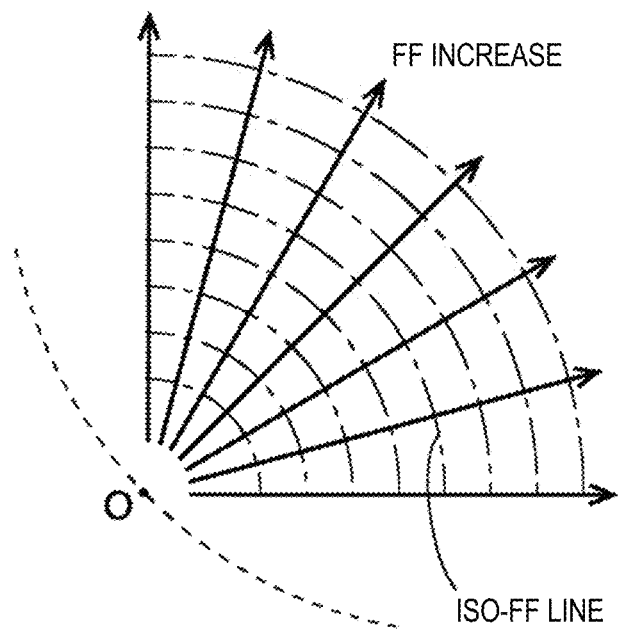
FIG. 13B is schematic diagram illustrating an example in which FF is increased in the direction extending radially from one origin.
Figure 14:
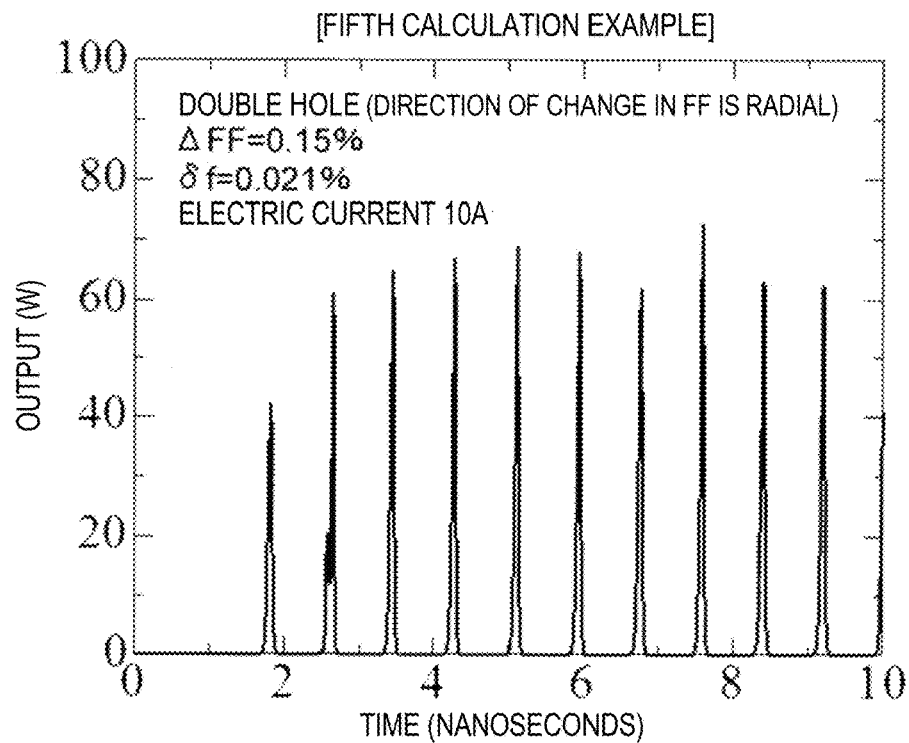
FIG. 14 is a graph illustrating a result of calculating the time change of the intensity of the emitted laser beam in the example illustrated in FIG. 13B (Fifth Calculation Example).

In all of the first to fourth calculation examples described so far, FF is monotonically increased in one direction inclined by 45° with respect to the square lattice. FIG. 13A illustrates a schematic diagram of such changes depending on the position of the FF. In this drawing, the direction in which the FF is increased is indicated by a solid arrow, and the line connecting the positions having the same FF (this line is called "iso-FF line") is indicated by an alternate long and short dash line. In the present invention, in addition to the example illustrated in FIG. 13A, for example, a change depending on the position of the FF may be formed as illustrated in a schematic view in FIG. 13B. In the example of FIG. 13B, the FF is increased in the direction indicated by a solid arrow extending radially from one origin O located on a boundary of the circular electric current supply region (indicated by the dashed line in the drawing), and the iso-FF line has an arc shape centered on the origin O. For the example of FIG. 13B, the time change of the intensity of the laser beam was calculated under the conditions that $FF_{min}$ was set to 0.075, $\Delta FF$ was set to 0.0015 (0.15%), the period length was set to 276 nm, the electric current supply region was set as a circle with a diameter of 1 mm, and the electric current supplied into the electric current supply region was set to 10 A. In this case, δf is 0.021%. FIG. 14 illustrates the calculation results. In this example, the pulsed laser beam oscillates repeatedly.

Sixth Calculation Example

Figure 15:
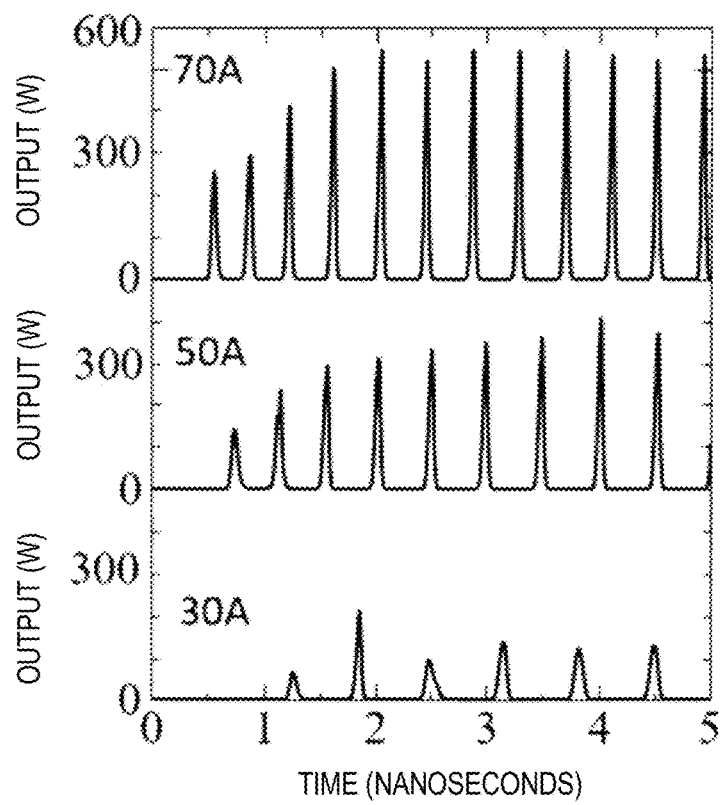
FIG. 15 is a graph illustrating a result obtained by calculating the time change of the intensity of the emitted laser beam in an example in which the filling factor changes continuously in a quadratic function in one direction, and the electric current supply region, ΔFF, and the electric current to be supplied are larger than in the example of FIG. 13B (Sixth Calculation Example).

Next, in the example of continuously increasing the FF in a quadratic function in one direction parallel to the base material 121 as in FIG. 11(b), for each of the three cases where the electric current supplied into the electric current supply region was increased to 30 A, 50 A and 70 A by expanding the electric current supply region to a circle with a diameter of 1.6 mm and increasing $\Delta FF$ to 0.003 (0.3%), the time change of the laser beam intensity was calculated. As in FIG. 11(b), the shape of the different refractive index portion was a double-hole type, the period length was set to 276 nm, and the $FF_{min}$ was set to 0.063. FIG. 15 illustrates the calculation results. According to this calculation result, a high peak output of 350 W or more when the electric current supplied into the electric current supply region is 50 A and 500 W or more when the same electric current is 70 A can be obtained.

Experimental Example

Figure 16:
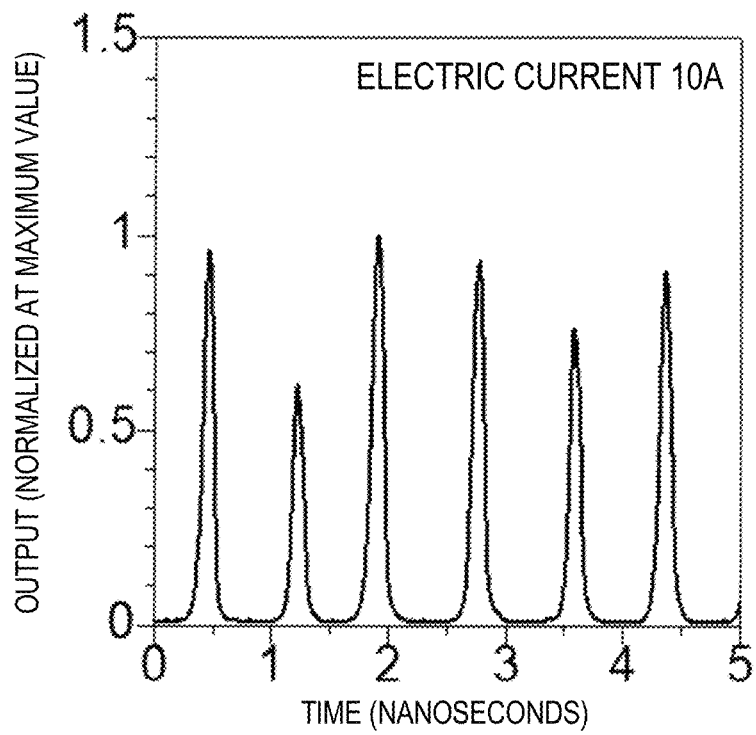
FIG. 16 is a graph illustrating a result obtained by calculating the time change of the intensity of the laser beam emitted, for the two-dimensional photonic-crystal surface-emitting laser of the present embodiment.

Similar to the first and second calculation examples, a two-dimensional photonic-crystal surface-emitting laser having a photonic crystal in which FF was continuously increased in a linear function with respect to one direction parallel to the base material was produced with a configuration in which the double-hole type different refractive index portions are arranged in a square lattice pattern under the conditions that a period length was set to 276 nm, $FF_{min}$ was set to 0.075, $\Delta FF$ was set to 0.22%, and an electric current supply region was set to a circle with a diameter of 1 mm. An experiment was conducted in which an electric current of 10 A was supplied into the electric current supply region of the prepared two-dimensional photonic-crystal surface-emitting laser. As a result, as illustrated in FIG. 16, it was confirmed that the pulsed laser beam was output with a repetition period of less than 1 ns (nanosecond). The intensity of the laser beam was measured by a streak camera.

Figure 17:
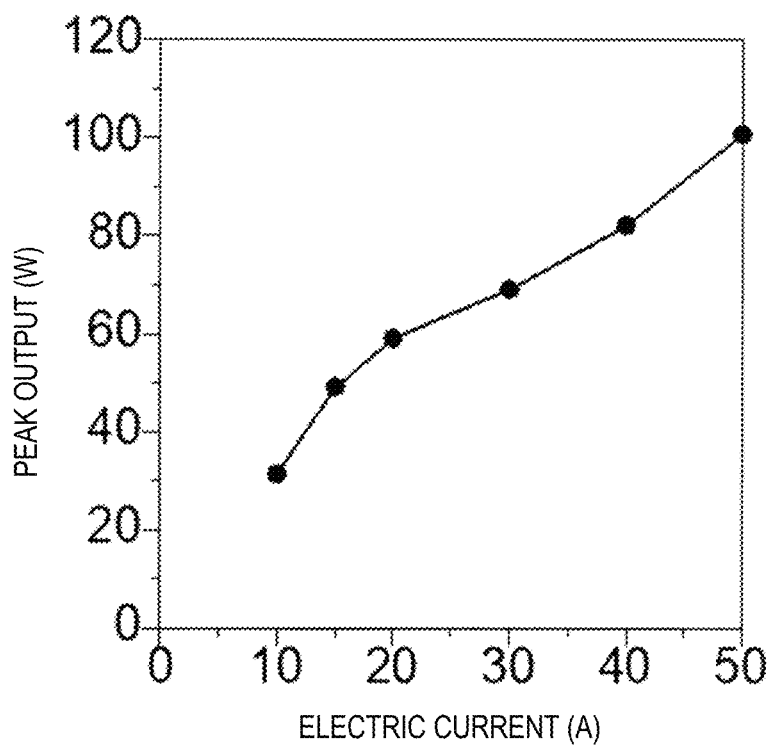
FIG. 17 is a graph illustrating a result obtained by an experiment on a relationship between a size of the supplied electric current and a peak intensity of the emitted laser beam, for the two-dimensional photonic-crystal surface-emitting laser of the present embodiment.
Figure 18:
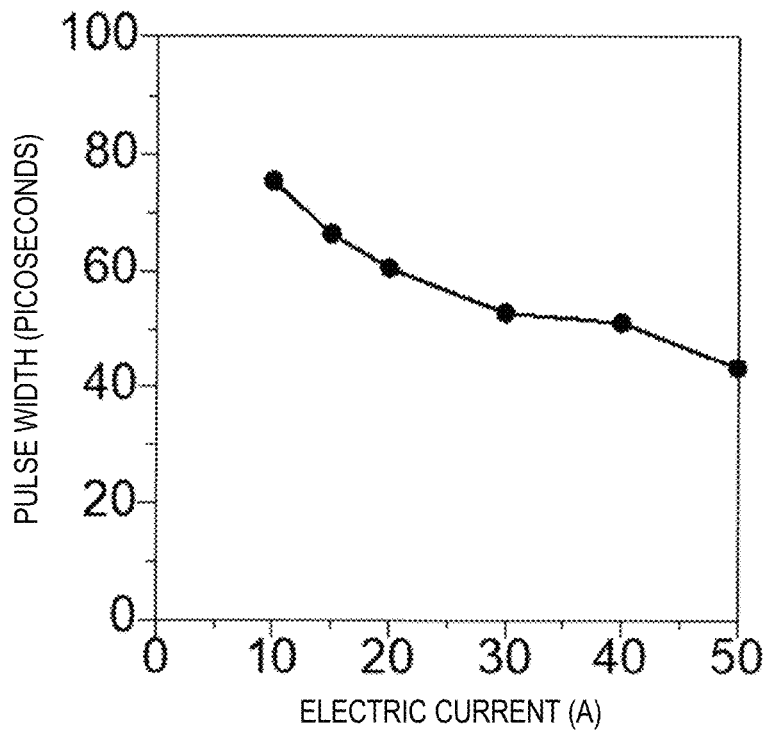
FIG. 18 is a graph illustrating a result obtained by an experiment on a relationship between a size of the supplied electric current and a peak width of the emitted laser beam, for the two-dimensional photonic-crystal surface-emitting laser of the present embodiment.

Next, for the prepared two-dimensional photonic-crystal surface-emitting laser, multiple experiments were performed in which the size of the electric current supplied into the electric current supply region was different within the range of 10 A to 50 A, and the output and pulse width (full width at half maximum) of the pulsed laser beam obtained in each experiment were measured. The output measurement results are illustrated in FIG. 17, and the pulse width measurement results are illustrated in FIG. 18. The larger the electric current supplied into the electric current supply region, the larger the output and the narrower the pulse width (the steeper the pulse). When the electric current was 50 A, a pulsed laser beam with a peak output of approximately 100 W and a pulse width of less than 50 picoseconds was obtained.

Figure 19:
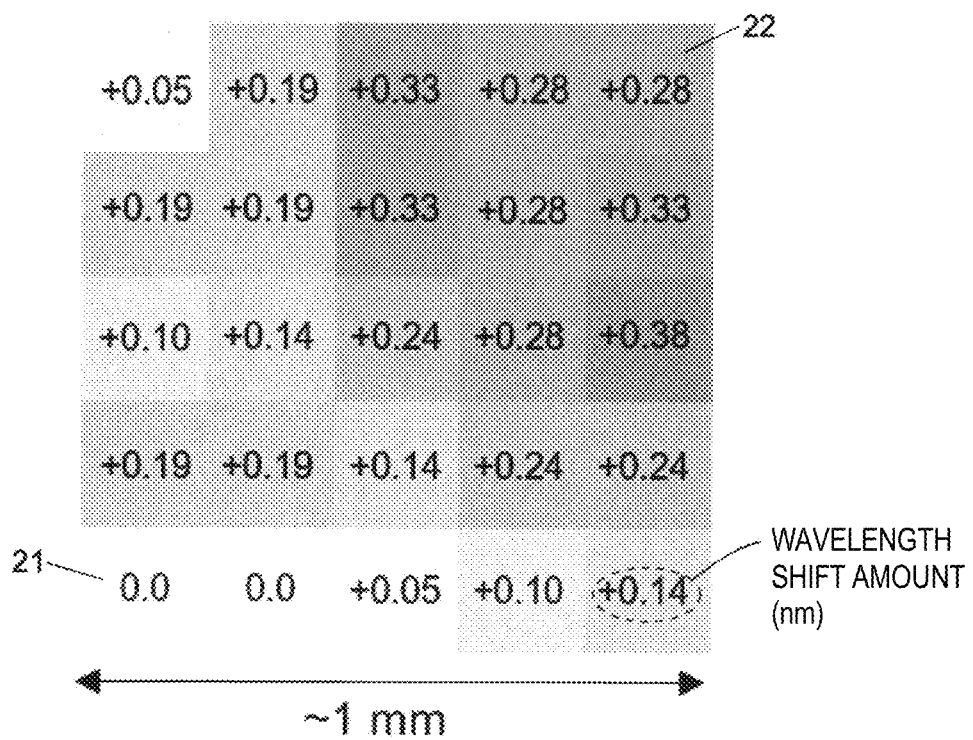
FIG. 19 is a diagram illustrating a result obtained by an experiment on a difference in a wavelength depending on a position in a photonic layer, for the two-dimensional photonic-crystal surface-emitting laser of the present embodiment.

Next, for the prepared two-dimensional photonic-crystal surface-emitting laser, the wavelength of spontaneous emission light output from each position in the photonic crystal layer in an in-plane direction was measured with the size of the electric current supplied into the electric current supply region set to 4 A. Here, each of the 25 sub-regions in the electric current supply region was set as a measurement target. FIG. 19 illustrates the calculation results. In FIG. 19, among these 25 sub-regions, the wavelength of the spontaneously emitted light emitted from the sub-region (leftmost and bottom sub-region 21 in the drawing) having the largest FF was used as a reference wavelength, and the size of deviation from the reference wavelength was indicated by a numerical value and brightness of background color in the other sub-regions. According to this drawing, the deviation from the reference wavelength is increased in a positive direction from the lower left to the upper right, which is the direction in which the FF is decreased. The difference in the wavelength between the rightmost and top sub-region 22 and the sub-region 21 is 0.28 nm, which corresponds to the case where ΔFF is 0.22%. As described above, in the two-dimensional photonic-crystal surface-emitting laser of the present embodiment, the wavelength of the emitted light differs by a maximum of about 0.3 nm depending on the position in the photonic crystal layer in the in-plane direction, but the difference is sufficiently smaller than a median wavelength (937.5 nm).

The embodiment of the two-dimensional photonic-crystal surface-emitting laser according to the present invention has been described above, including some modifications; however, the present invention is not limited to those embodiments and modifications, and various modifications are possible within the scope of the gist of the present invention.

REFERENCE SIGNS LIST

10 . . . Two-dimensional Photonic-crystal Surface-emitting Laser
11 . . . Active Layer
12 . . . Photonic Crystal Layer
120 . . . Electric Current Supply Region
121 . . . Base Material
122 . . . Different Refractive Index Portion
1221 . . . Main Different Refractive Index Portion
1222 . . . Sub-different Refractive Index Portion
123 . . . Unit Lattice
13 . . . Spacer Layer
141 . . . First Cladding Layer
142 . . . Second Cladding Layer
191 . . . First Electrode
192 . . . Second Electrode
1921 . . . Window Portion
1922 . . . Frame Portion
21, 22 . . . Sub-region in Photonic Crystal Layer

The invention claimed is:

1. A two-dimensional photonic-crystal surface-emitting laser,
wherein the two-dimensional photonic-crystal surface-emitting laser is configured to emit a pulsed laser beam, the two-dimensional photonic-crystal surface-emitting laser comprising:
a) an active layer;
b) a two-dimensional photonic crystal containing a base material having a plate shape and arranged on one side of the active layer and different refractive index portions arranged at lattice points of a predetermined lattice in the base material and having a refractive index different from that of the base material, a band edge frequency for each position in an electric current supply region, which is at least a part of the two-dimensional photonic crystal, is monotonically increased in one direction parallel to the base material; and
c) an electrode configured to continuously supply an electric current into the active layer and the electric current supply region.

2. The two-dimensional photonic-crystal surface-emitting laser according to claim 1, wherein
the different refractive index portions have a refractive index smaller than that of the base material, and
a filling factor, which is a ratio of a volume occupied by a different refractive index portion in a unit lattice constituting the lattice, is monotonically increased in the electric current supply region in the one direction.

3. The two-dimensional photonic-crystal surface-emitting laser according to claim 2, wherein a planar area of each of the different refractive index portions is monotonically increased in the one direction in the electric current supply region.

4. The two-dimensional photonic-crystal surface-emitting laser according to claim 1, wherein
the different refractive index portions have a refractive index larger than that of the base material, and
a filling factor, which is a ratio of a volume occupied by a different refractive index portion in a unit lattice constituting the lattice, is monotonically decreased in the electric current supply region in the one direction.

5. The two-dimensional photonic-crystal surface-emitting laser according to claim 4, wherein a planar area of each of the different refractive index portions is monotonically decreased in the one direction in the electric current supply region.

6. The two-dimensional photonic-crystal surface-emitting laser according to claim 1, wherein a period length of the lattice is monotonically decreased in the one direction in the electric current supply region.

7. The two-dimensional photonic-crystal surface-emitting laser according to claim 1, wherein the band edge frequency is continuously increased in the one direction in the electric current supply region.

8. The two-dimensional photonic-crystal surface-emitting laser according to claim 1, wherein the band edge frequency is increased stepwise in the one direction in the electric current supply region.

9. The two-dimensional photonic-crystal surface-emitting laser according to claim 1, wherein each of the different refractive index portions has a non-circular planar shape.

* * * * *